United States Patent
Khan

(10) Patent No.: US 11,206,045 B1
(45) Date of Patent: Dec. 21, 2021

(54) EFFICIENT DETERMINATION OF PARITY BIT LOCATION FOR POLAR CODES

(71) Applicant: Xilinx, Inc., San Jose, CA (US)

(72) Inventor: Zahid Khan, Midlothian (GB)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 16/937,253

(22) Filed: Jul. 23, 2020

(51) Int. Cl.
*H03M 13/13* (2006.01)
*H03M 13/09* (2006.01)

(52) U.S. Cl.
CPC ......... *H03M 13/13* (2013.01); *H03M 13/098* (2013.01)

(58) Field of Classification Search
CPC .............................. H03M 13/13; H03M 13/098
See application file for complete search history.

(56) References Cited

U.S. PATENT DOCUMENTS

| | | | |
|---|---|---|---|
| 8,930,790 B1* | 1/2015 | Tsatsaragkos | .... H03M 13/6572 714/752 |
| 10,664,283 B2 | 5/2020 | Guo et al. | |
| 2020/0007160 A1* | 1/2020 | Li | ..................... H03M 13/6561 |
| 2020/0052719 A1* | 2/2020 | Chaki | ................. H03M 13/616 |

OTHER PUBLICATIONS

3GPP, 3rd Generation Partnership Project; Technical Specification Group Radio Access Network; NR; Multiplexing and Channel Coding (Release 15), TS 38.212, V15.6.0, pp. 1-101, Jun. 2019.

* cited by examiner

*Primary Examiner* — Thien Nguyen
(74) *Attorney, Agent, or Firm* — Paradice and Li LLP

(57) ABSTRACT

An apparatus for determining a bit index for a parity bit of a polar codeword is disclosed. Each index of a polar codeword may have an associated weight and an associated reliability value. The apparatus may compare the weights and reliability values of a group of bit indices in parallel to determine a bit index of the group associated with the lowest weight and highest reliability value. Additional groups may be processed until all of the bit indices of the polar codeword have been examined and the bit index with the lowest weight and highest reliability value is identified.

20 Claims, 12 Drawing Sheets

EFFICIENT DETERMINATION OF PARITY BIT LOCATION FOR POLAR CODES

TECHNICAL FIELD

Aspects of the present disclosure generally relate to polar codes, and specifically to an efficient determination of parity bit locations for polar codewords.

BACKGROUND

Polar codes have been adopted by the 3rd generation partnership project (3GPP) for control channel coding in 5G systems. Typical polar codes, such as the polar code described in the Release-15 standard, include multiple types of data bits, including information bits, cyclic redundancy check (CRC) bits, parity check bits, and frozen bits. The location of the information bits, CRC bits, parity check bits, and frozen bits in a polar codeword varies based on conditions including polar codeword length, data interleaving, rate matching operations, reliability values, and the like. Moreover, the polar codeword must be decoded (e.g., information bits located and corrected based on parity check bits) in a timely fashion to meet the latency requirements of one or more communication systems, including 5G systems.

Accordingly, it is desirable to provide a low latency determination of the location of one or more of the polar codeword bits to enable a timely decoding of the polar codeword.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to an apparatus to determine a bit index of a parity bit in a polar codeword. The apparatus may include a first comparator configured to select a first bit index of the polar codeword and determine a first weight value associated with the first bit index, a second comparator configured to select a second bit index of the polar codeword and determine a second weight value associated with the second bit index, and a first priority comparator. The first priority comparator may be coupled to the first comparator and the second comparator and configured to select a first minimum weight value representing the lesser of the first weight value and the second weight value and identify a bit index of the polar codeword associated with the first minimum weight value, wherein the bit index of the parity bit in the polar codeword is based at least in part on the identified bit index associated with the first minimum weight.

A method is disclosed to determine an index of a parity bit in a polar codeword. The method may include selecting a first bit index of the polar codeword, determining a first weight value associated with the first bit index, determining a second weight value associated with the second bit index, selecting a first minimum weight value representing the lesser of the first weight value and the second weight value, and identifying a bit index of the polar codeword associated with the first minimum weight value, wherein the bit index of the parity bit in the polar codeword is based at least in part on the identified bit index associated with the first minimum weight value.

A device is disclosed that may include a transceiver configured to transmit a polar codeword and an apparatus configured to determine an index for a parity bit of the polar codeword. The apparatus may include a first comparator configured to select a first bit index of the polar codeword and determine a first weight value associated with the first bit index, a second comparator configured to select a second bit index of the polar codeword and determine a second weight value associated with the second bit index, and a first priority comparator. The first priority comparator may be coupled to the first comparator and the second comparator and configured to select a first minimum weight value representing the lesser of the first weight value and the second weight value and identify a bit index of the polar codeword associated with the first minimum weight value, wherein the bit index of the parity bit in the polar codeword is based at least in part on the identified bit index associated with the first minimum weight.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Aspects of the present disclosure describe a method and apparatus for determining the location of a parity bit in a polar codeword. The apparatus may examine the weight and reliability values associated with a plurality of polar codeword data bits in parallel to decrease the latency associated with determining the location of one or more parity bits.

Figure 1A:
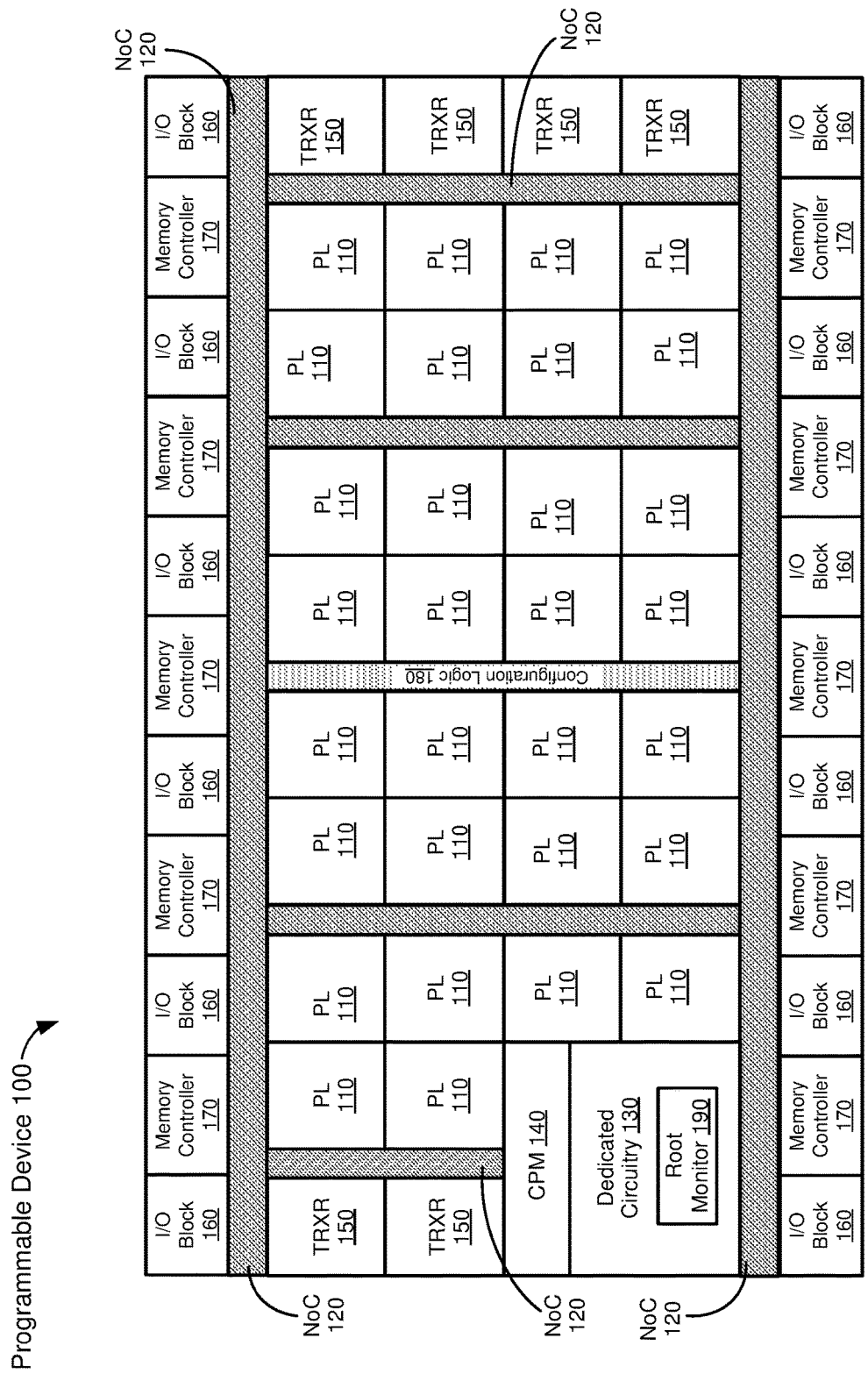
FIG. 1A shows a block diagram of an example programmable device within which various aspects of the present disclosure may be implemented.

FIG. 1A shows a block diagram of an example programmable device 100 within which various aspects of the present disclosure may be implemented. The programmable device 100 may include a number of subsystems such as, for example, programmable logic (PL) 110, a network-on-chip (NoC) interconnect system 120 spanning the PL 110, dedicated circuitry 130, a CCIX and PCIe Module (CPM) 140, transceiver blocks 150, input/output (I/O) blocks 160, memory controllers 170, configuration logic 180, and a root monitor 190. In one or more implementations, the programmable device 100 may include other subsystems or components not shown in FIG. 1A. Further, although not shown for simplicity, the programmable device 100 may be coupled to a number of peripheral components (such as a high-performance memory device) and/or other devices or chips (such as another programmable device).

The PL 110 includes programmable circuitry that may be configured or programmed to perform a multitude of different user-defined functions or operations. In some implementations, the PL 110 may include a plurality of programmable circuit blocks implemented as repeatable tiles arranged in columns in the programmable device 100, for example, as depicted in FIG. 1A. The programmable circuit blocks, which may also be referred to as programmable fabric sub-regions (FSRs), may each include programmable interconnect circuitry and programmable logic circuitry. In some implementations, the programmable circuit blocks may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design.

The programmable interconnect circuitry within each of the programmable circuit blocks or tiles may include a plurality of interconnect wires of varying lengths interconnected by programmable interconnect points (PIPs). The interconnect wires may be configured to provide connectivity between components within a particular programmable tile, between components within different programmable tiles, and between components of a programmable tile and other subsystems or devices. The programmable interconnect circuitry and the programmable circuit blocks may be programmed or configured by loading configuration data into configuration registers that define how the programmable elements are configured and operate to implement a corresponding user-specified circuit design. In some aspects, the programmable interconnect circuitry within each of a number of the programmable circuit blocks may form part of a programmable interconnect fabric (not shown for simplicity) that provides block-level and/or device-level signal routing resources for the programmable device 100.

The NoC interconnect system 120, which may be fabricated as part of the programmable device 100, may include any number of horizontal segments and vertical segments (and/or diagonal segments) connected together to implement a high-speed, high-bandwidth programmable signal routing network that can selectively interconnect various device resources (such as the PL 110, the dedicated circuitry 130, the CPM 140, the transceiver blocks 150, the I/O blocks 160, the memory controllers 170, the configuration logic 180, and the root monitor 190) with each other and with other components not shown for simplicity. For the example implementation of FIG. 1A, the NoC interconnect system 120 is shown to include two horizontal segments and four vertical segments. A first horizontal segment extending across the width of the programmable device 100 is positioned along a bottom boundary of the programmable device 100, and a second horizontal segment extending across the width of the programmable device 100 is positioned along the top boundary of the programmable device 100. The four vertical segments extend across the height of the programmable device 100 and are connected to the first and second horizontal segments of the NoC interconnect system 120. In some aspects, the horizontal segments may allow the NoC interconnect system 120 to exchange signals and data with the I/O blocks 160 and memory controllers 170 without any intervening circuits or interfaces, and the vertical segments may allow the NoC interconnect system 120 to exchange signals and data with the transceiver blocks 150, the dedicated circuitry 130, and the CPM 140 without any intervening circuits or interfaces. In other implementations, the NoC interconnect system 120 may include other numbers of horizontal and vertical segments, which in turn may occupy other positions of the programmable device 100. Thus, the particular layout, shape, size, orientation, and other physical characteristics of the example NoC interconnect system 120 depicted in FIG. 1A are merely illustrative of the various implementations disclosed herein.

The NoC interconnect system 120 may be configured to transmit information between various device resources as data packets that can be individually addressed and routed from a source location to a destination location. In some aspects, the data packets transmitted on the NoC interconnect system 120 may be dynamically addressable. In one or more implementations, the NoC interconnect system 120 may employ a suitable data packet protocol (such as token ring protocol) and/or use memory-mapped addresses to route data packets from any number of source locations to any number of destination locations. The data packets may include header information (such as source addresses, destination addresses, and protocol information) that can be used by the NoC interconnect system 120 to route the data packets to their indicated destinations.

Although not shown for simplicity, the NoC interconnect system 120 may also include a scheduler and arbitration logic. The scheduler may be used to schedule the transmission of data packets from a source address to a destination address using one or more physical and/or virtual channels of the NoC interconnect system 120. The arbitration logic may be used to arbitrate access to the NoC interconnect system 120, for example, to minimize collisions and other contention-related latencies. For implementations in which the programmable device 100 is fabricated using stacked silicon interconnect (SSI) technology, the columnal portions of the NoC interconnect system 120 may provide signal connections between adjacent super logic regions (SLRs), for example, to allow configuration data to be routed between master and slave SLRs.

The NoC interconnect system 120 may be programmed by loading configuration data into corresponding configuration registers that define how various switches, interfaces, and routers within or associated with the NoC interconnect system 120 are configured to implement a particular user-specified circuit design. In some implementations, the NoC interconnect system 120 may include a plurality of nodes, ports, or other interfaces (not shown for simplicity) that provide selective connectivity between the NoC interconnect system 120 and the various resources, subsystems, circuits, and other components of the programmable device 100. For example, the NoC interconnect system 120 may allow multiple subsystems of the programmable device 100 to share access to on-chip memory (OCM) resources, processing resources, I/O resources, and/or the transceiver blocks 150. The nodes, ports, or other interfaces of the NoC interconnect system 120 may be programmed to implement a particular connectivity profile by loading configuration data into one or more associated configuration registers.

By selectively interconnecting the various resources, subsystems, circuits, and other components of the programmable device 100 that can demand and use large amounts of data, the NoC interconnect system 120 may alleviate signal routing burdens on local interconnect resources, thereby increasing device performance and allowing for greater configuration flexibility than other programmable devices. Moreover, by providing a high-performance signal routing network having higher data transmission rates and lower error rates than device-level and block-level programmable interconnects, the NoC interconnect system 120 may increase the processing power and data throughput of the programmable device 100 (as compared to other programmable devices).

The dedicated circuitry 130 may include any suitable hard-wired circuits including (but not limited to) processors, serial transceivers, digital signal processors (DSPs), analog-to-digital converters (ADCs), digital-to-analog converters (DACs), device management resources, device monitoring resources, device testing management resources, and so on. In some embodiments, the dedicated circuitry 130 may include a processing system (PS) and a platform management controller (PMC). In some implementations, the PS may include one or more processor cores, cache memory, memory controllers, and unidirectional and/or bidirectional interfaces configurable to couple directly to the I/O pins of the programmable device 100. In some aspects, each processor core may include central processing units (CPU) or scalar processors that can be used for sequential data processing. The PMC may be used for booting and configuring the programmable device 100 based on configuration data (such as a configuration bitstream) provided from external memory. The PMC may also be used to configure the PL 110 and to control various encryption, authentication, root monitoring, and debug capabilities of the programmable device 100.

The CCIX and PCIe module (CPM) 140 may include a number of interfaces that provide connectivity between the programmable device 100 and a number of peripheral components (such as external devices or chips). In some implementations, the CPM 140 may include a plurality of peripheral interconnect express (PCIe) interfaces and cache coherent interconnect for accelerators (CCIX) interfaces that provide connectivity to other devices or chips via the transceiver blocks 150. In some aspects, the PCIe and CCIX interfaces may be implemented as part of the transceiver blocks 150.

The transceiver blocks 150 may provide signal connections with one or more other devices or chips (not shown for simplicity) connected to the programmable device 100. The transceiver blocks 150 may include a number of different serial transceivers such as, for example, gigabit serial transceivers (GTs). In some implementations, the transceiver blocks 150 may be implemented as a number of repeatable tiles positioned in various locations along the right and left sides of the programmable device 100, as depicted in FIG. 1A. In other implementations, the transceiver blocks 150 may be positioned in other suitable locations of the programmable device 100. The transceiver block 150 may include an interface to a wireless transceiver such as transceiver configured to communicate according to wireless standards, including standards promulgated by the 3rd-generation partnership project (3GPP). In some aspects, each bank of transceiver circuits within a given transceiver block 150 may include or may be coupled to a corresponding voltage supply, for example, so that each bank of transceiver circuits may be powered using a separate voltage supply.

The I/O blocks 160 are coupled to the programmable device's I/O pins (not shown for simplicity) and may provide I/O capabilities for the programmable device 100. For example, the I/O blocks 160 may receive data from one or more other devices and may drive the received data to a number of destinations within the programmable device 100. The I/O blocks 160 may also receive data from a number of sources in the programmable device 100 and may drive the received data to one or more other devices via the programmable device's I/O pins. In some implementations, the I/O blocks 160 may be implemented as repeatable tiles. The programmable device 100 may include any suitable number of I/O blocks 160, and therefore the example implementation depicted in FIG. 1A is merely illustrative.

The I/O blocks 160 may include any number of suitable I/O circuits or devices. In some implementations, the I/O blocks 160 may include extremely high-performance I/O (XPIO) circuits, high-density I/O (HDIO) circuits, and multiplexed I/O (MIO) circuits. The XPIO circuits may be optimized for high-performance communications such as providing a high-speed, low latency interface to the memory controllers 170. In one or more implementations, the XPIO circuits may include dedicated memory resources that can be accessed by other subsystems of the programmable device 100 without using the memory controllers 170. The HDIO circuits may provide a cost-effective solution that supports lower speed and higher voltage I/O capabilities (as compared with the XPIO circuits). The MIO circuits may provide general-purpose I/O resources that can be accessed by various subsystems such as, for example, the PL 110, the dedicated circuitry 130, and the CPM 140.

The memory controllers 170 may be used to control access to various memory resources provided within and/or external to the programmable device 100. In some implementations, the memory controllers 170 may be used to access dedicated memory residing in one or more of the I/O blocks 160. The memory controllers 170 may include double data rate v4 (DDR4) memory controllers, high bandwidth memory (HBM) controllers, and/or other suitable memory controllers. In one or more implementations, some or all of the memory controllers 170 may include a scheduler having transaction reordering capabilities that may improve memory access efficiency. In addition, or in the alternative, the repeatable tiles that implement the memory controllers 170 may be different from one another. For example, a first number of the memory controllers 170 may implement DDR4 memory controllers, a second number of the memory controllers 170 may implement LPDDR4 memory controllers, and a third number of the memory controllers 170 may implement HBM controllers.

The programmable device 100 may include any number of I/O blocks 160 and memory controllers 170, and therefore the numbers and positions of the I/O blocks 160 and memory controllers 170 depicted in FIG. 1A are merely illustrative. In some implementations, a first row of I/O blocks 160 and memory controllers 170 may be implemented as repeatable tiles positioned along the bottom edge of the programmable device 100, and a second row of I/O blocks 160 and memory controllers 170 may be implemented as repeatable tiles positioned along the top edge of the programmable device 100. In some implementations, the I/O blocks 160 and memory controllers 170 may be alternately positioned or distributed relative to each other, for example, as depicted in the example of FIG. 1A. In other implementations, a pair of I/O blocks 160 and memory controllers 170 may be implemented within the same repeatable tile.

In some implementations, the programmable device 100 may include one or more columns of connectivity fabric (not shown for simplicity) extending vertically across the height of the programmable device 100 and positioned in a vicinity of the transceiver blocks 150. The connectivity fabric may include one or more hard-wired circuits including (but not limited to) USB controllers, Ethernet MACs, multi-rate (MR) Ethernet MACs (MRMACs), PCIe controllers, CCIX controllers, and/or other components to provide connectivity between the transceiver blocks 150 and the PL 110.

The configuration logic 180 may be used to load configuration data (such as a configuration bitstream) from an external memory and route portions (such as frames, words, bytes, and/or bits) of the configuration data to the appropriate configuration registers that define how the various programmable resources of the programmable device 100 are configured. The configuration logic 180 may also be used to partially re-configure the programmable device 100 and/or to internally reconfigure one or more portions of the programmable device 100. In some implementations, the configuration logic 180 may include configuration registers, boundary-scan test circuitry (such as TAP controller circuitry), encryption circuitry to encrypt bitstreams of configuration data read out of the programmable device 100, and decryption circuitry to decrypt bitstreams of configuration data loaded into the programmable device 100.

Although not shown for simplicity, the programmable device 100 may include an interface between the programmable fabric and each of the rows of I/O blocks 160 and memory controllers 170 positioned on the boundary of the programmable device 100. This interface, which may be referred to herein as a Boundary Logic Interface (BLI), may allow large and complex external devices (such as HBM) to appear as much smaller blocks (such as a CLB) in the programmable fabric of the programmable device 100. In some implementations, the BLI may be arranged in rows positioned at the top and bottom boundaries or edges of the programmable fabric. In this manner, the BLI may be used to route signals between columnar logic structures (such as a CLB column or a DSP column) and rows of I/O resources (such as the I/O blocks 160).

In accordance with various aspects of the present disclosure, the programmable device 100 may include circuits that can generate a polar code bit stream compliant to standards such as the Release 15 standard adopted by the 3rd-generation partnership project (3GPP) for 5G systems. In some implementations, the polar code generator may be implemented by the PL 110 or in a dedicated circuit, not shown for simplicity. A polar code generator is described in more detail with respect to FIG. 2.

Note that FIG. 1A is intended to illustrate only one example architecture of the programmable device 100. For example, the numbers of logic blocks in a column (or row), the relative width of the columns (or rows), the number and order of columns (or rows), the types of logic blocks included in the columns (or rows), the relative sizes of the logic blocks, and other architectural aspects shown in FIG. 1A are merely illustrative of the various implementations of the inventive subject matter disclosed herein.

Figure 1B:
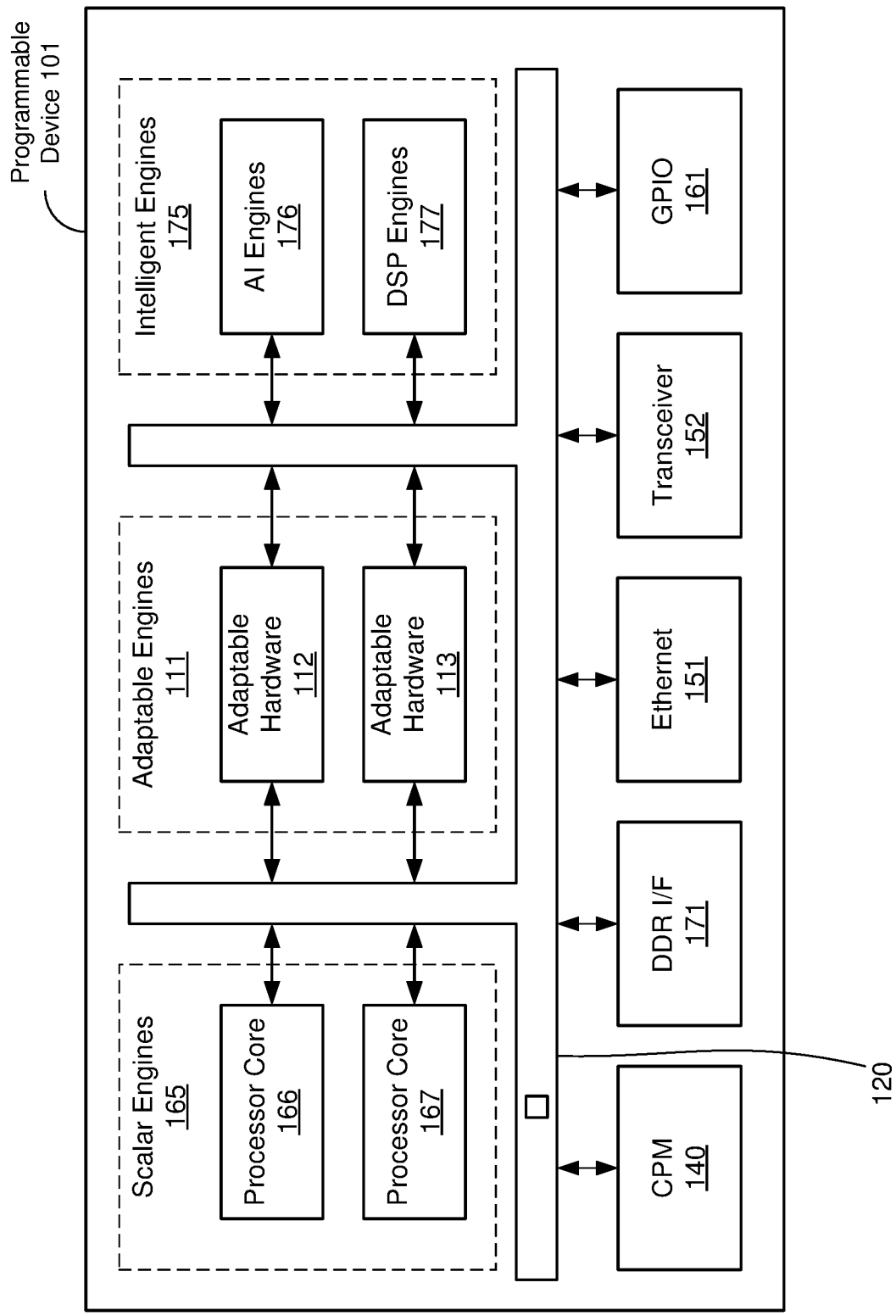
FIG. 1B shows a block diagram of another example programmable device within which various aspects of the present disclosure may be implemented.

FIG. 1B shows a block diagram of another example programmable device 101 within which various aspects of the present disclosure may be implemented. The programmable device 101 may be similar to the programmable device 100 of FIG. 1A and may share a number of subsystems in common. For example, the NoC interconnect system 120, and the CPM 140 may be as described with respect to FIG. 1A. In addition, the programmable device 101 may include scalar engines 165, adaptable engines 111, intelligent engines 175, a double data rate (DDR) memory interface 171, an ethernet block 151, a transceiver block 152, and a general-purpose input-output (GPIO) block 161. In some implementations, the programmable device 101 may be referred to as a system-on-a-chip (SoC).

The DDR memory interface 171 may be coupled to DDR memory (not shown for simplicity) to enable storage and retrieval of data for the programmable device 101. In some implementations, the DDR memory interface 171 may include DDR memory bus transceivers and a DDR memory controller (both not shown for simplicity) to interface with and control DDR memory circuits. The ethernet block 151 may include physical ethernet transceivers and an ethernet control module (not shown for simplicity) to enable data to be transmitted and received using one or more ethernet protocols.

The transceiver block 152 may include one or more circuits to enable high-speed data transfer to and from the programmable device 101. By way of example and not limitation, the transceiver block 152 may provide interfaces for 3GPP 5G signals. Other transceiver interfaces are possible such as 56G and 112G serial interfaces, and the like. The GPIO block 161 may include one or more circuits to support one or more pins that may be used to transmit (output) and/or receive (input) digital or analog signals.

The scalar engines 165 may include processor cores 166 and 167. Although two processor cores 166 and 167 are shown, the scalar engines 165 may include any feasible number of processor cores. In some embodiments, the processor cores 166 and 167 may include Advanced RISC Machine (ARM) cores, however other feasible processor cores are possible. The processor cores 166 and 167 may be configured to perform any number of processing tasks including numeric and/or procedural processing tasks.

The adaptable engines 111 may include adaptable hardware blocks 112 and 113. Although two adaptable hardware blocks 112 and 113 are shown, the adaptable engines 111 may include any feasible number of adaptable hardware blocks. In some embodiments, the adaptable hardware blocks 112 and 113 may include any feasible number programmable logic cells and memory cells. The programmable cells and memory cells may be configured to implement conventional programmable logic and/or FPGA designs as well as to form customized memory hierarchies for use within the programmable device 101.

The intelligent engines 175 may include an artificial intelligence (AI) engine block 176 and a DSP engine block 177. In other embodiments, the intelligent engines 175 may include any number of AI engine blocks 176 and any number of DSP engine blocks 177. The AI engine block 176 may include any feasible number of AI inference engines that may be configured to perform any number of inference processing and/or machine learning tasks. The DSP engine block 177 may include any feasible number of DSP processing cores that may be configured to perform any number of DSP tasks.

As described above, the NoC interconnect system 120 may provide selective connectivity between the NoC interconnect system 120 and the various resources, subsystems, circuits, and other components of the programmable device 101. For example, the NoC interconnect system 120 may enable data transfer between the scalar engines 165, the adaptable engines 111, the intelligent engines 175, the CPM 140, the DDR memory interface 171, the ethernet block 151, the transceiver block 152, and the GPIO block 161.

Similar to the programmable device 100, the programmable device 101 may also include a polar code generator to generate a polar code bit stream. The polar code generator may be included in the adaptable engines 111, the transceiver block 152, or any other feasible region or block of the programmable device 101.

Figure 2:
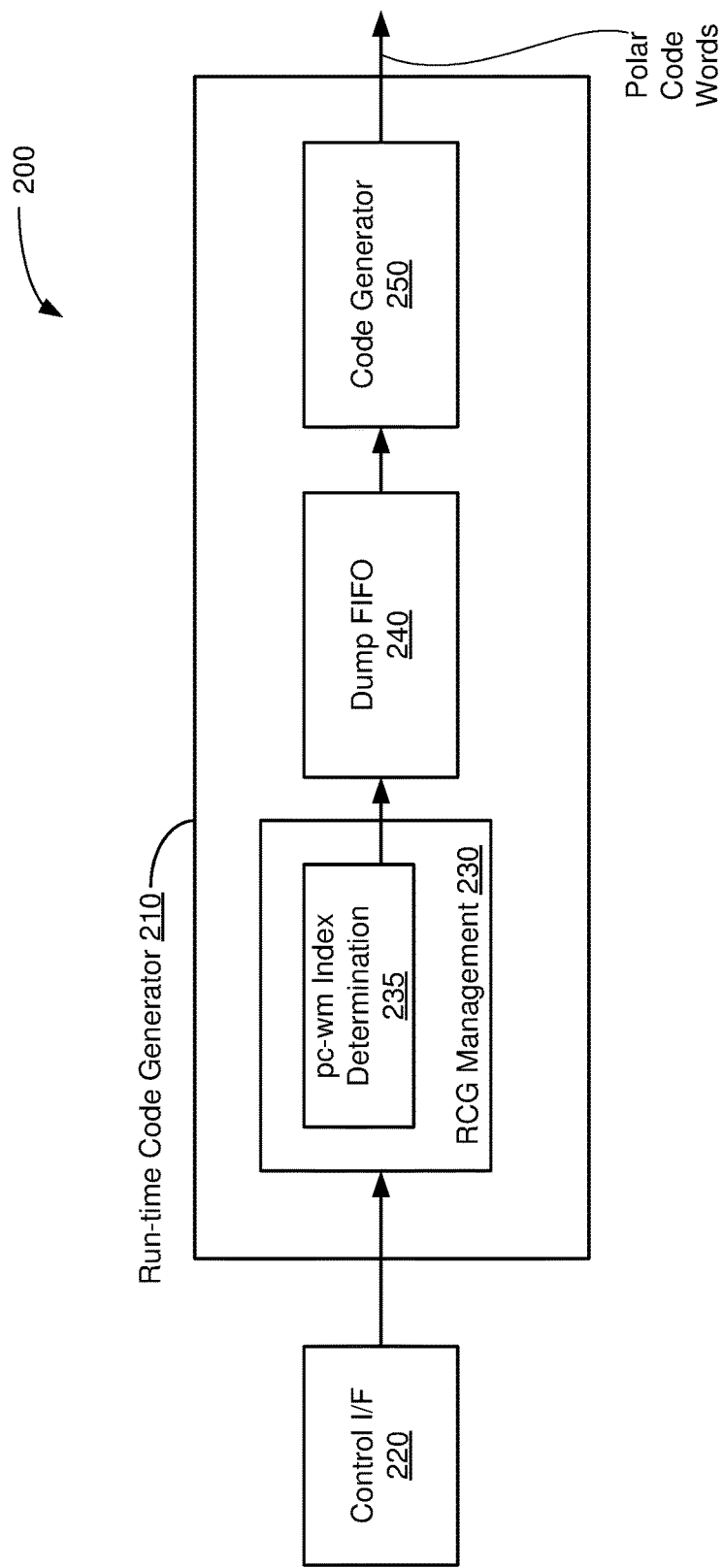
FIG. 2 is a block diagram of a polar code generator.

FIG. 2 is a block diagram of a polar code generator 200 that may include a control interface 220 and a run-time code generator (RCG) 210. The polar code generator 200 may generate a polar codeword that includes information bits, cyclic redundancy check (CRC) bits, parity check bits, and frozen bits. The information bits may include user data, while the CRC bits and the parity check bits may be forward error correction bits that assist in recovery and decoding of the user data after the polar codeword is transmitted through a communication channel. The frozen bits may be fixed (unchanging) bits. Frozen bits may be used to pad the polar codeword and achieve a particular codeword length. The term "non-frozen bits" is used herein to refer to any bits of a polar codeword that are not frozen bits. Therefore, the non-frozen bits may include information bits, CRC bits, and parity check bits.

The control interface 220 may provide control information used in the generation of the polar codewords. The control information may include rate matching sequence length information, and the number of information bits to be included in each polar codeword. The RCG 210 may include an RCG management block 230, a FIFO 240, and a code generator block 250.

The RCG management block 230 may receive the rate matching sequence length information and the number of the information bits included in the polar codeword from the control interface 220. The RCG management block 230 may generate other polar codeword parameters used for polar codeword generation. For example, the RCG management block 230 may generate CRC bits and parity bits, including parity check minimum weight (pc_wm) parity bits. A pc_wm parity bit is a special type of parity bit whose position (location) may vary within each polar codeword.

The RCG management block 230 may include a pc_wm index determination unit 235 to determine one or more bit indices (e.g., bit positions) for one or more pc_wm parity bits. The bit index of the pc_wm parity bits may be a bit index associated with a non-frozen bit having the lowest "weight" and highest reliability value. The pc_wm bit index indicates the "location" of the pc_wm parity bit within a polar codeword.

The weight associated with a bit index is determined by matrix operations used to generate the polar codewords. Polar codeword values are determined using a Kronecker matrix. Each row in the Kronecker matrix may have an associated "weight" that describes the number of "ones" in a binary representation of that row. A row with fewer ones is said to have has less weight than a row with more ones. Therefore, the weight associated with a bit index is the number of ones in the row of the Kronecker matrix used to generate the polar codeword value for that bit index.

Each bit in the polar codeword is assigned a reliability value that describes the likelihood of a particular transmitted bit to be accurately received and recovered. More reliable bit positions are used to carry information bits and CRC bits. Less reliable bit positions are generally used to carry parity check bits, frozen bits, and the like.

In some implementations, the pc_wm index determination unit 235 may determine the index of the pc_wm parity bits based at least on a weight of a Kronecker matrix associated with the bit index and the reliability value associated with the bit index, as discussed in more detail below with respect to FIGS. 3-5.

The RCG management block 230 may provide information bits, CRC bits, parity bits, one or more pc_wm parity bits, and the position of the one or more pc_wm parity bits in the polar codeword to the FIFO 240. The FIFO 240 may store this information until needed by the code generator block 250. The code generator block 250 may generate one or more polar codewords based on the data stored in the FIFO 240. The polar codewords from the code generator block 250 may be provided to other blocks such as a transmitter block to be transmitted as wireless signals, including 5G signals (transmitter block not shown for simplicity).

Figure 3:
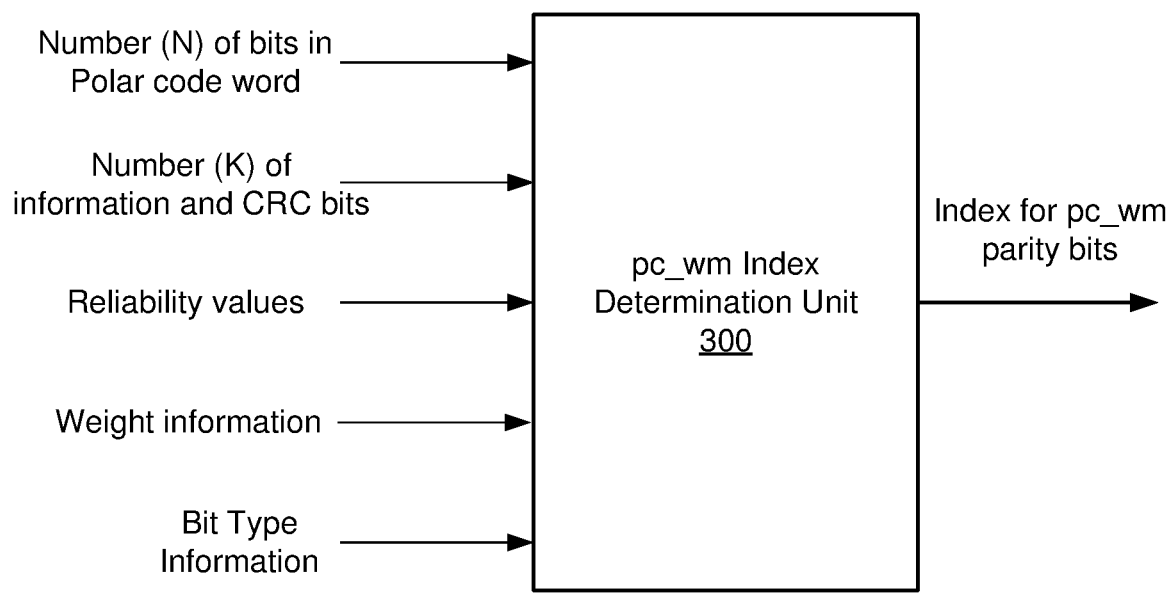
FIG. 3 is a block diagram of a bit index determination unit.

FIG. 3 is a block diagram of a pc_wm index determination unit 300 that receives information from the RCG management block 230 and provides one or more bit indices (e.g., location(s)) for one or more pc_wm parity bits in the polar codeword. The pc_wm index determination unit 300 may be one example of the pc_wm index determination unit 235 of FIG. 2 and may receive a number (N) representing the number of bits in the polar codeword, a number (K) representing the number information bits and CRC bits of the polar codeword, reliability values for each bit in the polar codeword, weight information indicating a weight associated with each bit in the polar codeword, and bit type information indicating whether each bit index of the polar codeword is associated with a frozen bit or a non-frozen bit.

The bit index of the pc_wm parity bit may correspond to the bit index of one of the non-frozen bits having the lowest weight and the highest reliability value. The pc_wm index determination unit 300 can examine the weight and the reliability values associated with each non-frozen bit index to identify the bit index associated with the lowest weight and highest reliability value. In some implementations, the pc_wm index determination unit 300 may examine the weights associated with each bit index in order of decreasing reliability value. If the lowest weight is associated with multiple bit indices, then the bit index with the higher reliability value is selected as the bit index for the pc_wm parity bit. In some cases, if more than one pc_wm parity bit is needed for a polar codeword, then the pc_wm index determination unit 300 can identify multiple bit indices with the lowest weight in order of decreasing reliability value.

The pc_wm index determination unit 300 may determine the number of parity bits (Npc) in the polar codeword based at least in part on the number N (number of bits in the polar codeword), and the number K (number of information bits and CRC bits in the polar codeword). In some implementations, the number of non-frozen bits may be represented by K+Npc.

Based on the determined number of non-frozen bits and the bit type information, the pc_wm index determination unit 300 can determine the weight and reliability values associated with each bit index associated with a non-frozen bit to identify the bit index associated with the lowest weight and highest reliability value. Example implementations of the pc_wm determination unit 300 are described in more detail with respect to FIGS. 4-5.

Figure 4A:
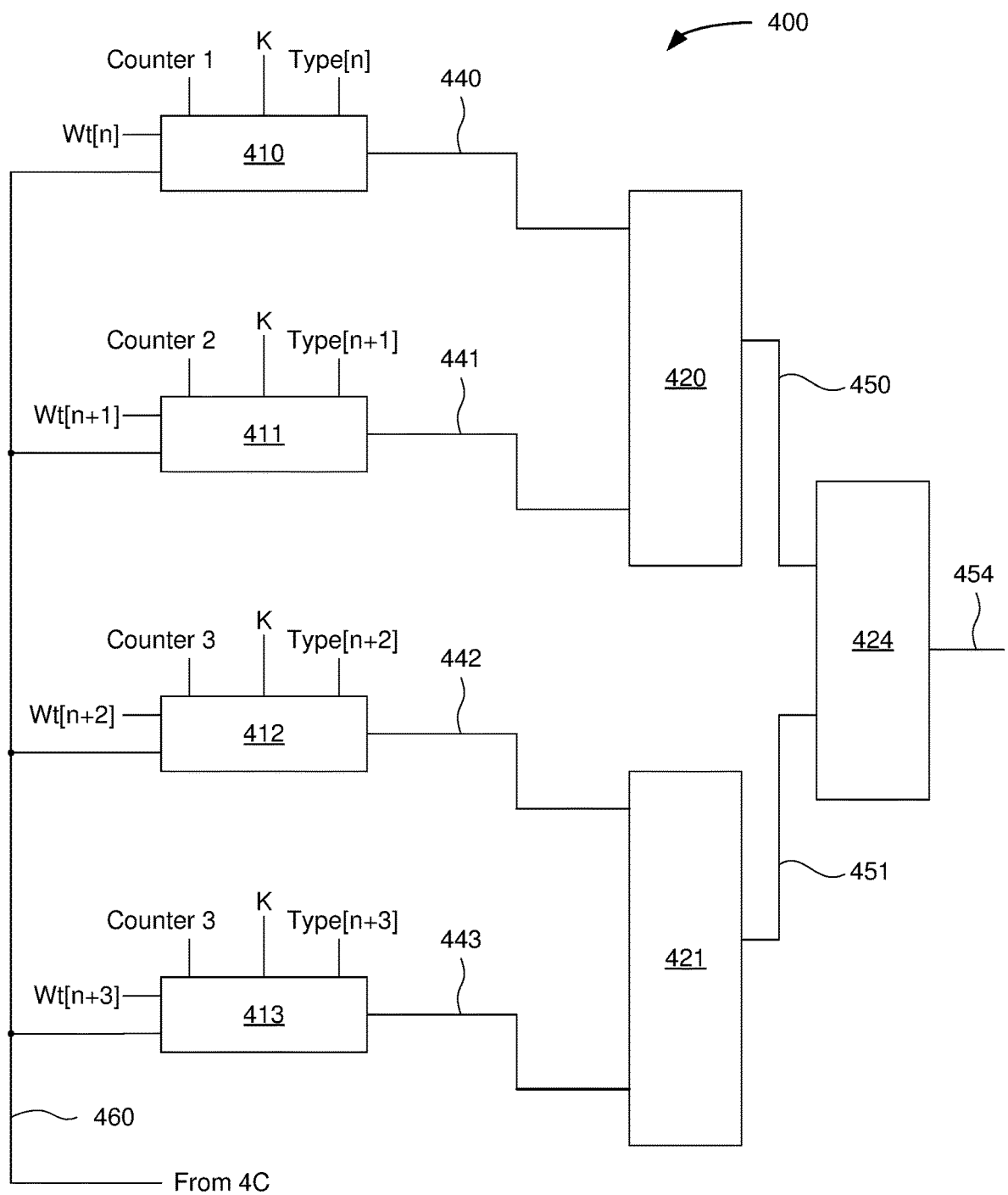
FIGS. 4A-4C show a detailed block diagram of one implementation of a pc_wm index determination unit.
Figure 4B:
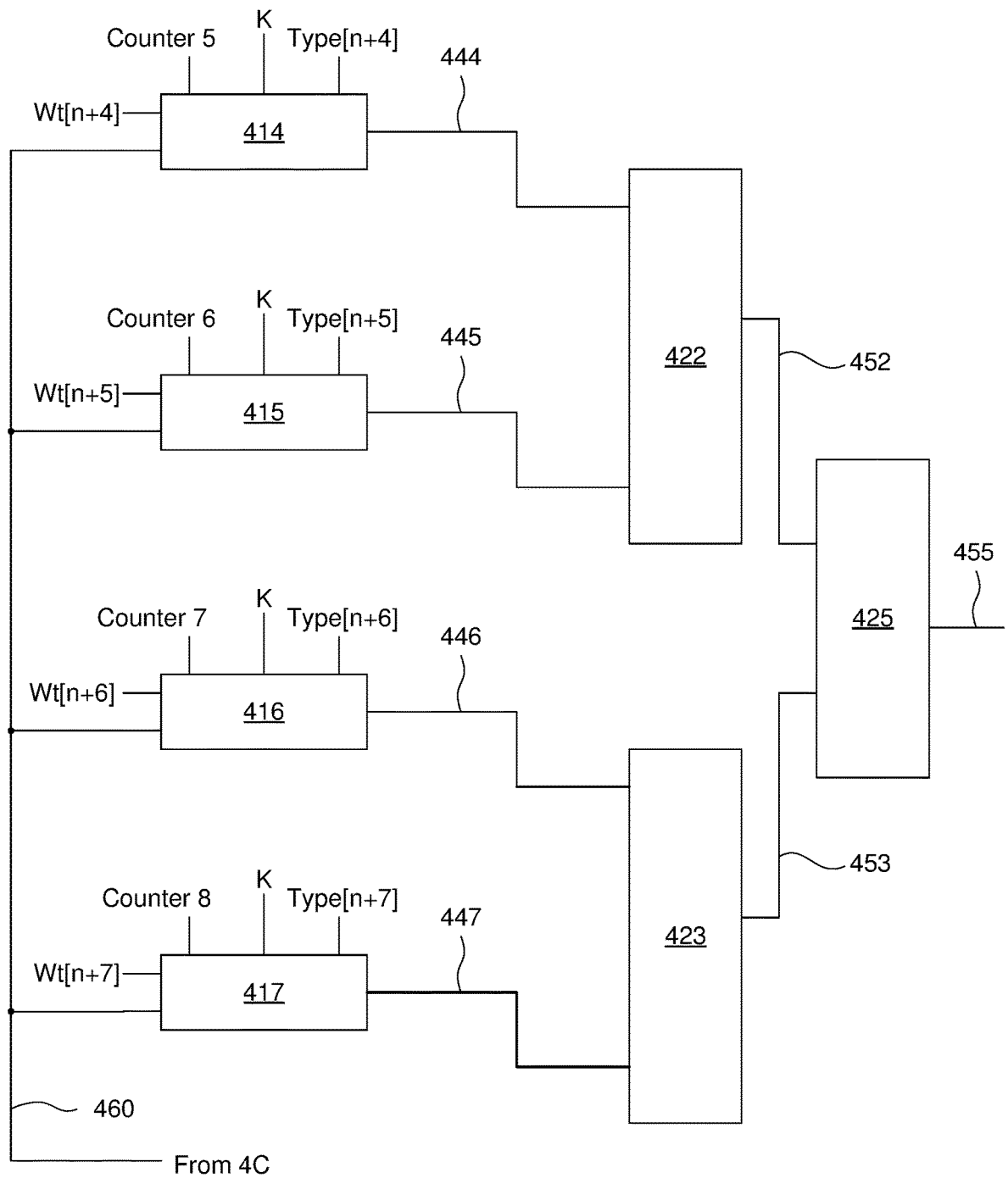
Figure 4C:
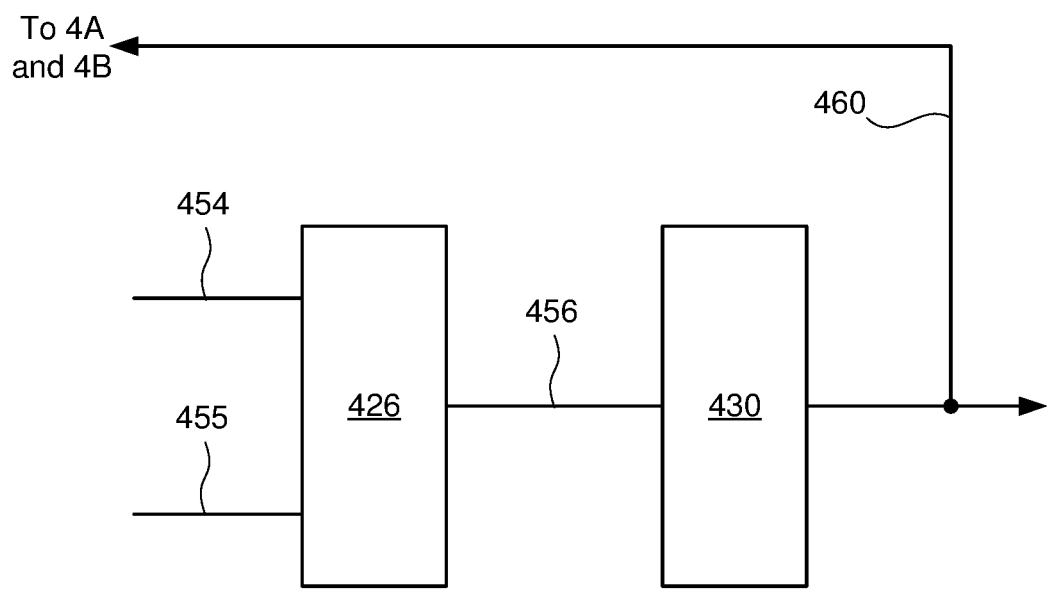

FIGS. 4A-4C show a detailed block diagram of one implementation of a pc_wm index determination unit 400. The pc_wm index determination unit 400 may be one example of the pc_wm index determination unit 235 or the pc_wm index determination unit 300 and may identify the bit index (or indices) of the non-frozen bits associated with the lowest weight and the highest reliability value. The pc_wm index determination unit 400 examines the weight and reliability values associated with multiple bit indices in parallel and subsequently uses a number of priority comparators to compare the information regarding the multiple bit indices to identify the bit index associated with the lowest weight and highest reliability value.

The pc_wm index determination unit 400 may include weight comparators 410-417, priority comparators 420-426, and a register 430. Although eight weight comparators 410-417 and seven priority comparators 420-426 are shown, in other implementations, the pc_wm index determination unit 400 may include any feasible number of weight comparators and priority comparators. The weight comparators 410-417 may compare the weights and reliability values associated with eight bit indices in parallel. The results from the weight comparators 410-417 are processed by the priority comparators 420-426. The priority comparators 420-426 determine the bit index associated with the lowest weight and highest reliability value from the eight bit indices examined by the weight comparators 410-417. The bit index associated with the lowest weight and highest reliability value, the weight and the reliability value information from the priority comparator 426 are stored in the register 430. The contents of the priority comparator 426 (e.g., the results from the weight comparators 410-417 and the priority comparators 420-426) are used in the next comparison of the weight and reliability values involving the next eight bit indices. This process may be repeated until the weights and reliability values associated with each bit of a polar codeword are examined, and the bit index associated with the lowest weight and highest reliability value is identified.

The weight comparator 410 may compare the weight and reliability values associated with a current bit index n to weight and reliability values associated with a previous bit index (referred to herein as previous comparator data 460) to generate an output 440. The previous comparator data 460 may include results of a previous iteration of the pc_wm index determination unit 400. The output 440 may include a bit index associated with the lowest weight and highest reliability value and the lowest weight selected from the current bit index n and the previous comparator data 460. The weight comparator 410 may receive a weight (wt[n]) associated with the bit index n, an indication of the number (K) of information bits and CRC bits in the polar codeword, bit type (type[n]) associated with the bit index n, and the contents (e.g., the count) of a non-frozen bit counter (counter 1). The weight and type information may be provided to the weight comparators 410-417 in order of descending reliability value. Thus, wt[n] received by the weight comparator 410 is associated with a higher reliability value than the wt[n+1] received by the weight comparator 411, and so on.

The weight comparator 410 first determines the bit type associated with the bit index n. The bit type may be frozen or non-frozen as indicated by type[n]. If the bit type type[n] indicates a non-frozen bit, then the count of the non-frozen bit counter (counter 1) is compared to the number K. The non-frozen bit counter (counter 1) helps to track the number of non-frozen bits are processed by the weight comparator 410. If K is less than the count of the non-frozen bit counter, then the weight comparator 410 compares the weight associated with the bit index n to the weight associated with the previous bit index (from the previous comparator data 460). If the weight associated with the bit index n is less than the weight associated with the previous bit index, then the weight associated with the bit index n and the bit index n are selected as outputs 440 of the weight comparator 410. On the other hand, if the weight associated with the bit index n is not less than the weight associated with the previous bit index, then the weight associated with the previous bit index and the previous bit index are selected as outputs 440 of the weight comparator 410.

In some implementations, if the weight associated with bit index n is the same as the weight associated with the previous bit index, then the weight comparator 410 selects the bit index associated with the previous comparator data 460. The selected bit index will be associated with the lowest weight and the highest reliability value because the previous comparator data 460 will have higher reliability values than current data. In other words, because the bit index n and the weight associated with the bit index is provided to the weight comparators 410-417 is in order of descending reliability value, previous outputs of the weight comparators 410-417 will have higher reliability values than the current weights associated with the bit index n.

The weight comparators 411-417 may operate similarly to the weight comparator 410. For example, the weight comparator 411 may receive the weight (wt[n+1]) and bit type (type[n+1]) of a successive bit index (n+1) as well as the previous comparator data 460. The weight comparator 411 may generate an output 441 that includes a bit index associated with the lowest weight and highest reliability value selected from the bit index n+1 and the previous comparator data 460. The output 441 also may include the weight associated with the selected bit index. In some implementations, the pc_wm index determination unit 400 may track the number of non-frozen bits that are processed by all weight comparators 410-417 through counters 1-8 to assist in the determination of the outputs 440-447.

The weight comparator 412 may receive the weight (wt[n+2]) and bit type (type[n+2]) of a successive bit index (n+2) as well as the previous comparator data 460. The weight comparator 412 may generate an output 442 that includes a bit index associated with the lowest weight and highest reliability value selected from the bit index n+2 and the previous comparator data 460. The output 442 also may include the weight associated with the selected bit index.

The weight comparator 413 may receive the weight (wt[n+3]) and bit type (type[n+3]) of a successive bit index (n+3) as well as the previous comparator data 460. The weight comparator 413 may generate an output 443 that includes a bit index associated with the lowest weight and highest reliability value selected from the bit index n+3 and the previous comparator data 460. The output 443 also may include the weight associated with the selected bit index.

The weight comparator 414 may receive the weight (wt[n+4]) and bit type (type[n+4]) of a successive bit index (n+4) as well as the previous comparator data 460. The weight comparator 414 may generate an output 444 that includes a bit index associated with the lowest weight and highest reliability value selected from the bit index n+4 and the previous comparator data 460. The output 444 also may include the weight associated with the selected bit index.

The weight comparator 415 may receive the weight (wt[n+5]) and bit type (type[n+5]) of a successive bit index (n+5) as well as the previous comparator data 460. The weight comparator 415 may generate an output 445 that includes a bit index associated with the lowest weight and highest reliability value selected from the bit index n+5 and the previous comparator data 460. The output 445 also may include the weight associated with the selected bit index.

The weight comparator 416 may receive the weight (wt[n+6]) and bit type (type[n+6]) of a successive bit index (n+6) as well as the previous comparator data 460. The weight comparator 416 may generate an output 446 that includes a bit index associated with the lowest weight and highest reliability value selected from the bit index n+6 and the previous comparator data 460. The output 446 also may include the weight associated with the selected bit index.

The weight comparator 417 may receive the weight (wt[n+7]) and (type[n+7]) of a successive bit index (n+7) as well as the previous comparator data 460. The weight comparator 417 may generate an output 447 that includes a bit index associated with the lowest weight and highest reliability value selected from the bit index n+7 and the previous comparator data 460. The output 447 may also include the weight associated with the selected bit index.

The weight and bit type information may be provided to the weight comparators 410-417 in order of decreasing reliability values. That is, the weight wt[n] and bit type type[n] received by the weight comparator 410 may be associated with bits indices having higher reliability values than the weight wt[n+1] and bit type [n+1] received by the weight comparator 411. The weight wt[n+1] and bit type type[n+1] received by the weight comparator 411 may be associated with bits indices having higher reliability values than the weight wt[n+2] and bit type type[n+2] received by the weight comparator 412, and so on. As a result, the outputs 440-447 of the weight comparators 410-417 may be in order of decreasing reliability values. For example, the output 440 may be associated with a higher reliability value than the output 441. Arranging the outputs 440-447 in order of descending reliability value may enable a reliability value-based comparison of the outputs 440-447 by the priority comparators 420-426.

The priority comparator 420 receives the outputs 440 and 441 from the weight comparators 410 and 411, respectively. As described above, the output 440 includes a weight and a bit index selected by the weight comparator 410 and the output 441 includes a weight and a bit index selected by the weight comparator 411. The priority comparator 420 compares the weights from each of the outputs 440 and 441 and selects the bit index associated with the lowest weight. If both bit indices have the same weight, then the priority comparator 420 selects the bit index from the weight comparator 410 since bit index n and the associated weight provided to the weight comparator 410 is more reliable (e.g., has a higher reliability value) than the bit index n+1 and the associated weight provided to the weight comparator 411. The priority comparator 420 may output the selected bit index and the associated weight as output 450. In this manner, the priority comparator 420 outputs the weight and bit index having the highest reliability value and lowest weight among the bit indices selected by the weight comparators 410 and 411.

In a similar manner, the priority comparator 421 receives the outputs 442 and 443 from the weight comparators 412 and 413, respectively. The priority comparator 421 selects the bit index associated with the lowest weight and highest reliability value from the outputs 442 and 443. The priority comparator 421 outputs the selected bit index and the associated weight as output 451.

The priority comparator 422 receives the outputs 444 and 445 from the weight comparators 414 and 415, respectively. The priority comparator 422 selects bit index associated with the lowest weight and highest reliability value from the outputs 444 and 445. The priority comparator 422 outputs the selected bit index and the associated weight as output 452.

The priority comparator 423 receives the outputs 446 and 447 from the weight comparators 416 and 417 respectively. The priority comparator 423 selects a bit index associated with the lowest weight and highest reliability value from the outputs 446 and 447. The priority comparator 423 outputs the selected bit index and the associated weight as output 453. Since the inputs to the priority comparators 420-423 are arranged in order of decreasing reliability values, the outputs 450-453 are also in order of decreasing reliability values.

The priority comparator 424 may operate similar to the priority comparators 420-423. However, instead of receiving bit index and weight information from the weight comparators 410-417, the priority comparator 424 receives the outputs 450 and 451. The priority comparator 424 selects a lowest weight and a bit index associated with the lowest weight and highest reliability value among the outputs 450 and 451 and outputs the selected bit index and the associated weight as output 454.

Similarly, the priority comparator 425 receives the outputs 452 and 453 from the priority comparators 422 and 423, respectively. The priority comparator 425 selects a lowest weight and a bit index associated with the lowest weight and highest reliability value among the outputs 452 and 453 and output the selected bit index and the associated weight as output 455.

The priority comparator 426 receives the outputs 454 and 455 from the priority comparators 424 and 425, respectively. The priority comparator 426 selects a lowest weight and a bit index associated with the lowest weight and highest reliability value among the outputs 454 and 455 and outputs the selected bit index and the associated weight as output 456.

As a result, the output 456 includes the bit index associated with the lowest weight and highest reliability value and the associated weight of the polar codeword bits from bit n to bit n+7. The output 456 of the priority comparator 426 is stored by the register 430 and fed back to the weight comparators 410-417 as the previous comparator data 460.

The pc_wm index determination unit 400 operates on data for eight bit indices in parallel, thereby decreasing processing time compared to serially processing bit index data. In one implementation, propagation time from the inputs of the weight comparators 410-417 to the input of the register 430 is less than one clock cycle. Thus, the pc_wm index determination unit 400 processes information associated with eight bit indices each clock cycle. During a successive clock cycle, the data associated with the next eight bit indices is provided to the weight comparators 410-417 and the pc_wm index determination unit 400 once again determines the bit index associated with the lowest weight. This process is repeated until the pc_wm index determination unit 400 has examined data for all the bit indices of the polar codeword and has identified and stored the bit index associated with the lowest weight and the highest reliability value in the register 430. The bit index stored in the register 430 may be used as the bit index for the pc_wm parity bit in a polar codeword.

In the example of FIG. 4A-4C, the pc_wm index determination unit 400 identifies a single bit index and associated weight. However, in other implementations, the pc_wm index determination unit 400 may identify a group of bit indices having a lowest weight and highest reliability value. For example, the weight comparators 410-417 and priority comparators 420-426 may be configured to select two or more bit indices with the lowest weight and highest reliability value. In this manner, the pc_wm index determination unit 400 may identify multiple bit indices for use with multiple pc_wm parity bits.

Figure 5A:
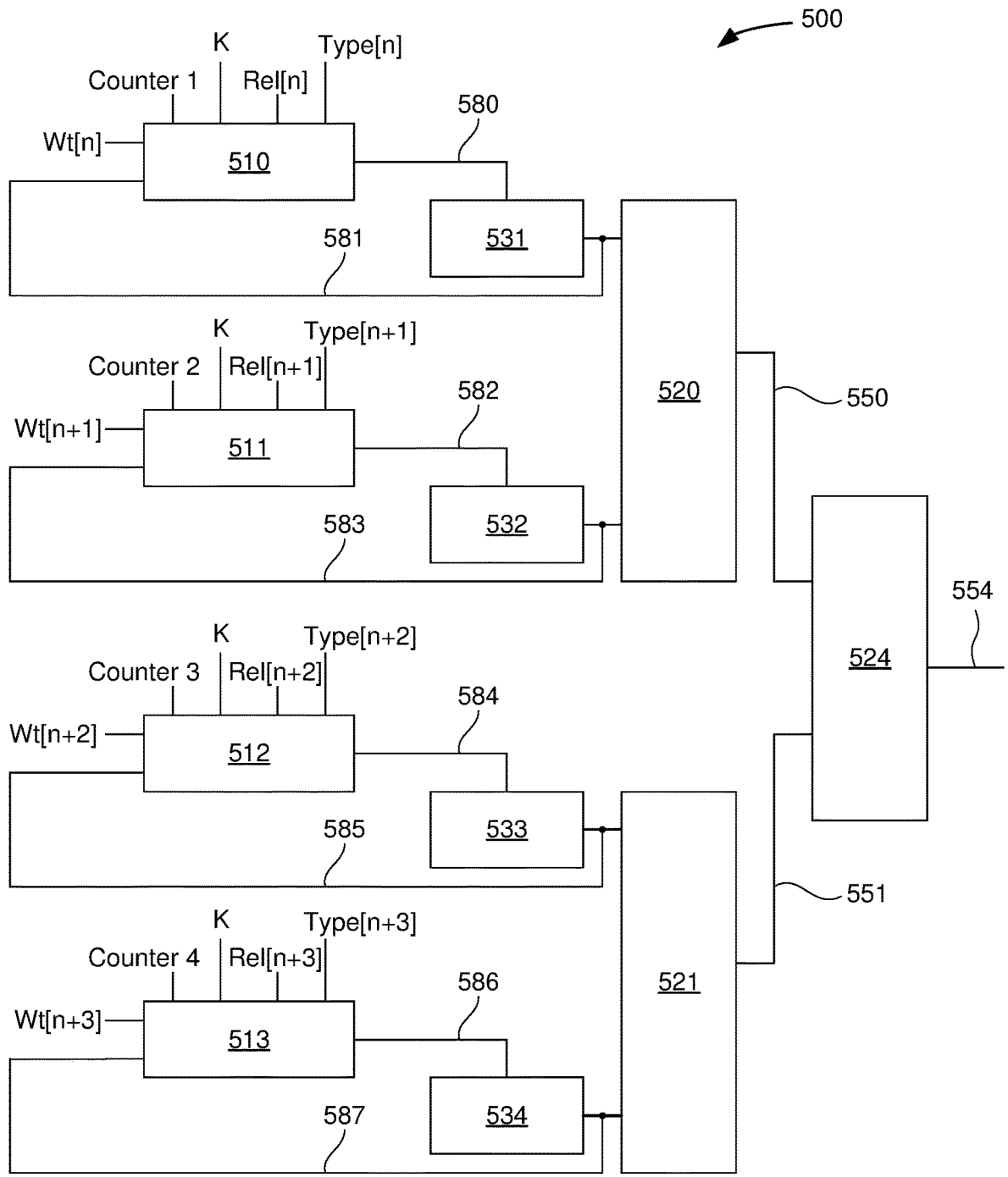
FIGS. 5A-5C show a detailed block diagram of another implementation of a pc_wm index determination unit.
Figure 5B:
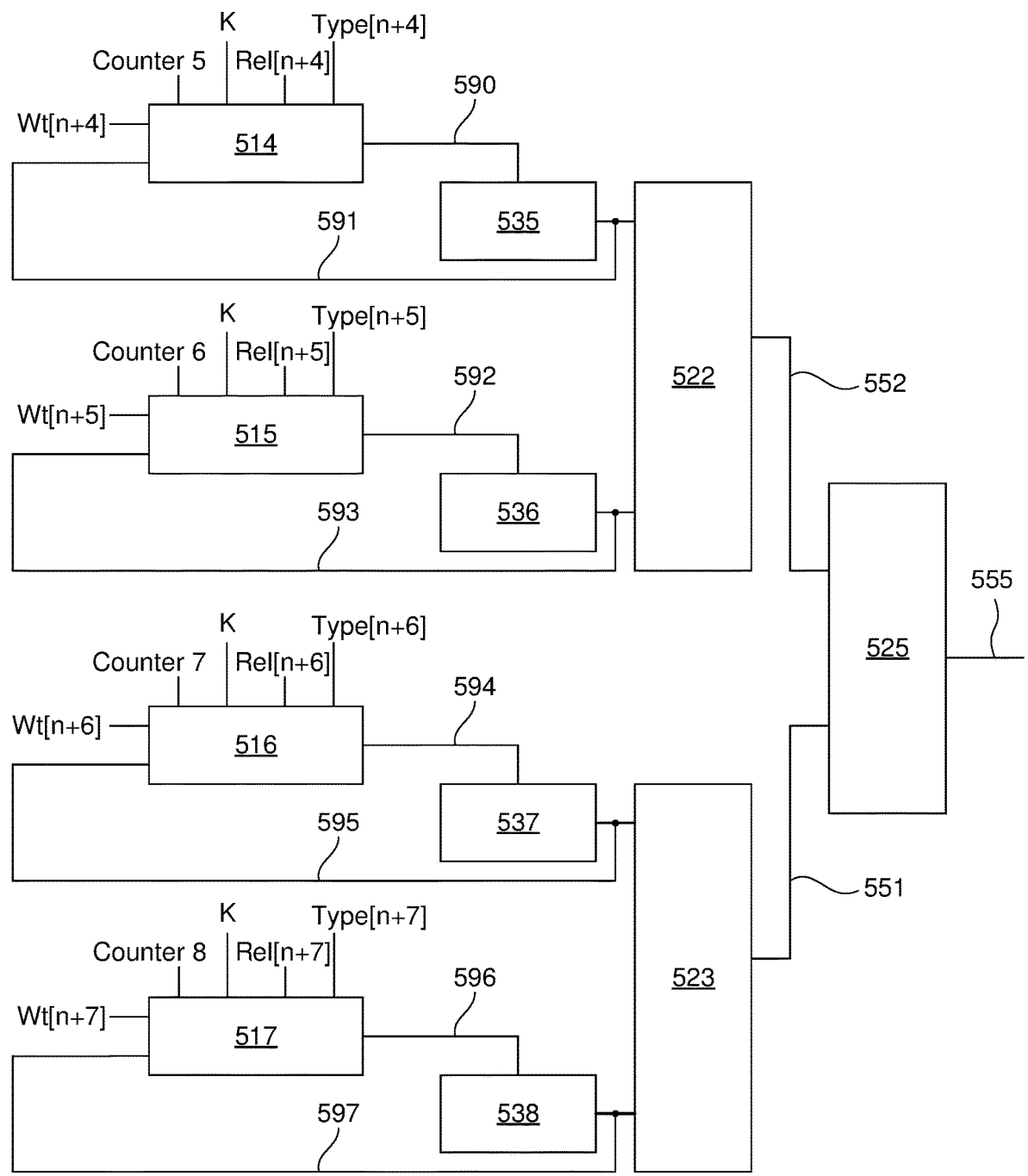
Figure 5C:
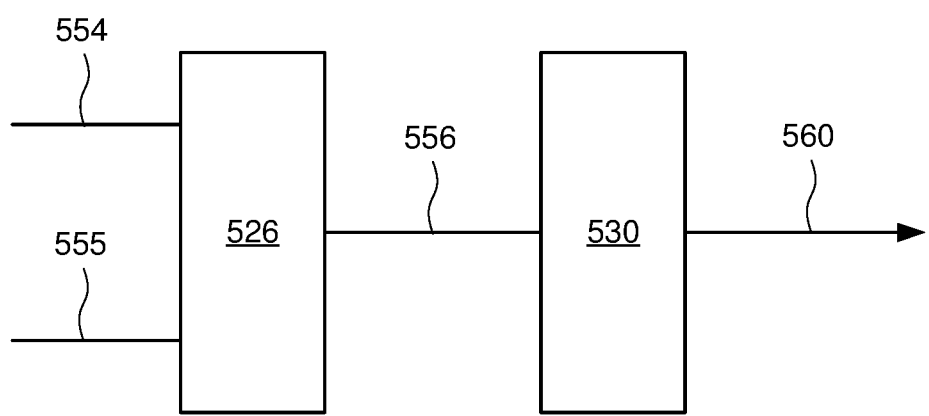

FIGS. 5A-5C show a detailed block diagram of one implementation of a pc_wm index determination unit 500. The pc_wm determination unit 500 and may be one example of the pc_wm index determination unit 235 or the pc_wm index determination unit 300 and may identify the bit index (or indices) of the non-frozen bits associated with the lowest weight and the highest reliability value. The pc_wm index determination unit 500 may include weight comparators 510-517, priority comparators 520-526, and registers 530-538. Although eight weight comparators 510-517, seven priority comparators 520-526, and nine registers 530-538 are shown, in other implementations, the pc_wm index determination unit 500 may include any feasible number of weight comparators, priority comparators, and registers.

The pc_wm index determination unit 500 may operate substantially similar to the pc_wm index determination unit 400. However, the pc_wm index determination unit 500 includes the registers 531-538 to pipeline intermediate results from the weight comparators 510-517 and break up signal propagation time of the pc_wm index determination unit 500. The registers 531-538 store and feedback weight comparator output signals locally (e.g., directly from the output to the input) for each associated weight comparator 510-517. This local feedback loop means that the relative relationship of the reliability values present in the pc_wm index determination unit 400 is not present in the pc_wm index determination unit 500. Thus, reliability values associated with each bit index are included with the output of the weight comparators 510-517 and are used and propagated by the priority comparators 520-526.

The weight comparator 510 may compare the weight and reliability values associated with a current bit index n to weight and reliability values associated with a previous comparator data 581 to generate an output 580. The output 580 may include a bit index associated with the lowest weight and highest reliability value, the lowest weight, and the related reliability value selected from the current bit index n and the previous comparator data 581. The previous comparator data 581 may include bit index, weight, and reliability values previously output by the weight comparator 510 and provided by the register 531. The weight comparator 510 may receive a weight (wt[n]) associated with the bit index n, an indication of the number (K) of information bits and CRC bits in the polar codeword, bit type (type[n]) associated with the bit index n, the contents of a non-frozen bit counter (counter 1), and a reliability value associated with the bit index n (shown as rel[n]).

The weight comparator 510 first determines the bit type associated with the bit index n. The bit type may be frozen or non-frozen as indicated by type[n]. If the bit type represents a non-frozen bit, then the count of the non-frozen bit counter (counter 1) is compared to the number K. If K is less than the count of the non-frozen bit counter, then the weight comparator 510 compares the weight and reliability values associated with the bit index n (e.g., wt[n] and rel[n]) and the weight and reliability values included in the previous comparator data 581.

If the weight wt[n] is less than the weight included the previous comparator data 581, then the weight wt[n], the bit index n, and the reliability value rel[n] are selected as output 580. On the other hand, if the weight wt[n] is not less than the weight included in the previous comparator data 581, then the weight, the bit index, and the reliability value included in the previous comparator data 581 are selected and output as output 580. The output 580 is stored in the register 531 and the output of the register 531 is the previous comparator data 581.

The weight comparators 511-517 may operate similarly to the weight comparator 510. For example, the weight comparator 511 may receive the weight (wt[n+1]), bit type (type[n+1]), and reliability value (rel[n+1]) of a successive bit index (n+1) as well as the previous comparator data 583 from register 532. The weight comparator 511 may provide an output 582 that includes a weight, a reliability value, and a bit index associated with the lowest weight and highest reliability value selected from the wt[n+1], rel[n+1] and bit index n+1 and the previous comparator data 583. The output 582 is stored in the register 532 and the output of the register 532 is the previous comparator data 583.

The weight comparator 512 may receive the weight (wt[n+2]), bit type (type[n+2]), and reliability value (rel[n+2]) of a successive bit index (n+2) as well as previous comparator data 585 from register 533. The weight comparator 512 may provide an output 584 that includes a weight, a reliability value, and a bit index associated with the lowest weight and highest reliability value selected from either the weight, reliability value, and bit index associated with the bit index n+2 or the weight, reliability value, and bit index of the previous comparator data 585. The output 584 is stored in the register 533 and the output of the register 533 is the previous comparator data 585.

The weight comparator 513 may receive the weight (wt[n+3]), bit type (type[n+3]), and reliability value (rel[n+3]) of a successive bit index (n+3) as well as previous comparator data 587 from register 534. The weight comparator 513 may provide an output 586 that includes a weight, a reliability value, and a bit index associated with the lowest weight and highest reliability value selected from either the weight, reliability value, and bit index associated with the bit index n+3 or the weight, reliability value, and bit index of the previous comparator data 587. The output 586 is stored in the register 534 and the output of the register 534 is the previous comparator data 587.

The weight comparator 514 may receive the weight (wt[n+4]), bit type (type[n+4]), and reliability value (rel[n+4]) of a successive bit index (n+4) as well as previous comparator data 591 from register 535. The weight comparator 514 may provide an output 590 that includes a weight, a reliability value, and a bit index associated with the lowest weight and highest reliability value selected from either the weight, reliability value, and bit index associated with the bit index n+4 or the weight, reliability value, and bit index of the previous comparator data 591. The output 590 is stored in the register 535 and the output of the register 535 is the previous comparator data 591.

The weight comparator 515 may receive the weight (wt[n+5]), bit type (type[n+5]), and reliability value (rel[n+5]) of a successive bit index (n+5) as well as previous comparator data 593 from register 536. The weight comparator 515 may provide an output 592 that includes a weight, a reliability value, and a bit index associated with the lowest weight and highest reliability value selected from either the weight, reliability value, and bit index associated with the bit index n+5 or the weight, reliability value, and bit index of the previous comparator data 593. The output 592 is stored in the register 536 and the output of the register 536 is the previous comparator data 593.

The weight comparator 516 may receive the weight (wt[n+6]), bit type (type[n+6]), and reliability value (rel[n+6]) of a successive bit index (n+6) as well as previous comparator data 595 from register 537. The weight comparator 516 may provide an output 594 that includes a weight, a reliability value, and a bit index associated with the lowest weight and highest reliability value selected from either the weight, reliability value, and bit index associated with the bit index n+6 or the weight, reliability value, and bit index of the previous comparator data 595. The output 594 is stored in the register 537 and the output of the register 537 is the previous comparator data 595.

The weight comparator 517 may receive the weight (wt[n+7]), bit type (type[n+7]), and reliability value (rel[n+7]) of a successive bit index (n+7) as well as previous comparator data 597 from register 538. The weight comparator 517 may provide an output 596 that includes a weight, a reliability value, and a bit index associated with the lowest weight and highest reliability value selected from either the weight, reliability value, and bit index associated with the bit index n+7 or the weight, reliability value, and bit index of the previous comparator data 597. The output 596 is stored in the register 538 and the output of the register 538 is the previous comparator data 597.

The priority comparator 520 receives the previous comparator data 581 from the register 531 and the previous comparator data 583 from the register 532. The priority comparator 520 compares the weights and the reliability values from the previous comparator data 581 and the previous comparator data 583 and selects a bit index associated with the lowest weight and highest reliability value, the associated weight, and the associated reliability value. If the weights from the previous comparator data 581 and the previous comparator data 583 are equal, then the priority comparator 520 selects the bit index having a higher reliability value. The priority comparator 520 outputs the selected bit index, the related weight and the related reliability value as output 550.

In a similar manner, the priority comparator 521 receives the previous comparator data 585 and the previous comparator data 587. The priority comparator 521 selects a bit index associated with the lowest weight and highest reliability value, the associated weight, and the associated reliability value from the previous comparator data 585 and the previous comparator data 587. The priority comparator 521 outputs the selected bit index, the related weight, and the related reliability value as output 551.

The priority comparator 522 receives the previous comparator data 591 and the previous comparator data 593. The priority comparator 522 selects a bit index associated with the lowest weight and highest reliability value, the associated weight, and the associated reliability value from the previous comparator data 591 and the previous comparator data 593. The priority comparator 522 outputs the selected bit index, the related weight, and the related reliability value as output 552.

The priority comparator 523 receives the previous comparator data 595 and the previous comparator data 597. The priority comparator 523 selects a bit index associated with the lowest weight and highest reliability value, the associated weight, and the associated reliability value from the previous comparator data 595 and the previous comparator data 597. The priority comparator 523 outputs the selected bit index, the related weight, and the related reliability value as output 555.

The priority comparator 526 receives the output 554 from the priority comparator 524 and the output 555 from the priority comparator 525. The priority comparator 526 selects a bit index associated with the lowest weight and highest reliability value from the output 554 or the output 555 and outputs the selected bit index as output 556. Thus, the bit index output by the priority comparator 526 is the bit index associated with the lowest weight and highest reliability value of the polar codeword bits. The output 556 is stored in the register 530.

The pc_wm index determination unit 500 operates on data for eight bit indices in parallel, thereby decreasing processing time compared to serially processing bit index data. During a successive clock cycle, the data associated with the next eight bit indices is provided to the weight comparators 510-517 and the pc_wm index determination unit 500 once again determines the bit index associated with the lowest weight and highest reliability value. This process is repeated until data for all the bit indices of the polar codeword are examined and the bit index associated with the lowest weight and the highest reliability value is identified and stored in the register 530. The identified bit index stored in the register 530 (output 560) may be used as the index for the pc_wm parity bit in a polar codeword.

In some implementations, additional registers may be used to pipeline intermediate results within the pc_wm index determination unit 500. For example, a register may be added between the priority comparator 520 and the priority comparator 524 and between the priority comparator 521 and the priority comparator 524. Similarly, a register may be added between the priority comparator 522 and the priority comparator 525 and between the priority comparator 523 and the priority comparator 525. Still other registers may be added in any other feasible location.

Figure 6:
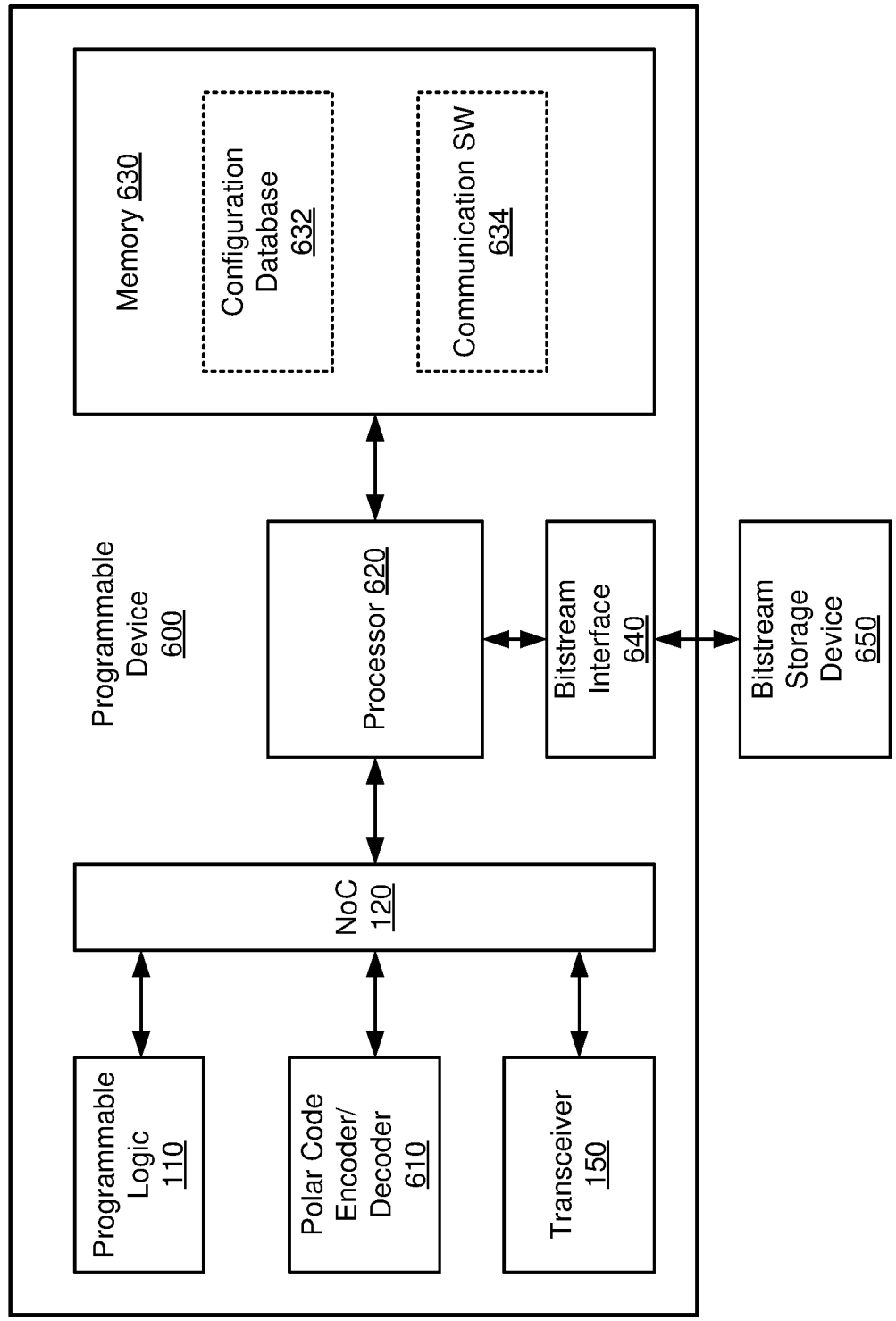
FIG. 6 shows a block diagram of an example programmable device, in accordance with some implementations.

FIG. 6 shows a block diagram of an example programmable device 600, in accordance with some implementations. The programmable device 600, which may be one example of the programmable device 100 of FIG. 1A or the programmable device 101 of FIG. 1B, may include PL 110, the NoC interconnect system 120, transceiver block 150, a polar code encoder/decoder 610, a processor 620, a memory 630, and a bitstream interface 640. The example of FIG. 6 depicts the PL 110, the polar code encoder/decoder 610, the transceiver block 150, and the processor 620 coupled to each other via the NoC interconnect system 120. In other implementations, one or more of the PL 110, polar code encoder/decoder 610, the transceiver block 150, and the processor 620 may be coupled to each other using other suitable signal routing resources of the programmable device 600. In addition, or in the alternative, the programmable device 600 may include additional components, devices, functional units and the like not shown here for simplicity.

The polar code encoder/decoder 610 may generate and/or receive polar codes. In some implementations, the polar code encoder/decoder 610 may include the RCG 210 of FIG.

2 (not shown for simplicity). The RCG 210 may generate one or more bits for the polar codes including pc_wm parity bits located at bit indices associated with non-frozen bits having the lowest weight and highest reliability value. In some implementations, the polar code encoder/decoder 610 may include the pc_wm index determination unit 400, the pc_wm index determination unit 500, or any other feasible pc_wm index determination unit to determine a bit index for the pc_wm parity bits.

The processor 620 may be any suitable one or more processors capable of executing scripts or instructions of one or more software programs stored in the memory 630. In some implementations, the processor 620 may be or include one or more microprocessors providing the processor functionality and external memory providing at least a portion of machine-readable media. In other implementations, the processor 620 may be or include an Application Specific Integrated Circuit (ASIC) with the processor, the bus interface, the user interface, and at least a portion of the machine-readable media integrated into a single chip or device.

The memory 630 may include a configuration database 632 that stores one or more configuration files of the programmable device 600. The programmable device 600 may be configured to operate in accordance with a user-specified design by loading configuration data (included in the configuration file) into corresponding configuration registers. In some implementations, a plurality of configuration files may be stored in the configuration database 632. In other implementations, a plurality of configuration files may be stored in a bitstream storage device 650 coupled to the processor 620 by the bitstream interface 640. The bitstream storage device 650 may be a memory device, such as flash memory, electrically erasable memory, or any other feasible memory device providing persistent data storage. Thus, the processor 620 may retrieve a configuration file from the configuration database 632 or from the bitstream storage device 650 through the bitstream interface 640 to configure the programmable device 600.

The memory 630 may also include a non-transitory computer-readable storage medium (e.g., one or more nonvolatile memory elements, such as EPROM, EEPROM, Flash memory, a hard drive, etc.) that may store a communication software (SW) module 634. The communication SW module 634 may include instructions that, when executed by the processor 620, cause the programmable device 600 to perform the corresponding functions. The non-transitory computer-readable medium of the memory 630 thus includes instructions for performing all or some of the operations of FIG. 7. In some implementations, the communication SW module 634 may generate polar codes through the polar code encoder/decoder 610 that determines one or more bit indices associated with a polar code having the lowest weight and highest reliability values.

Figure 7:
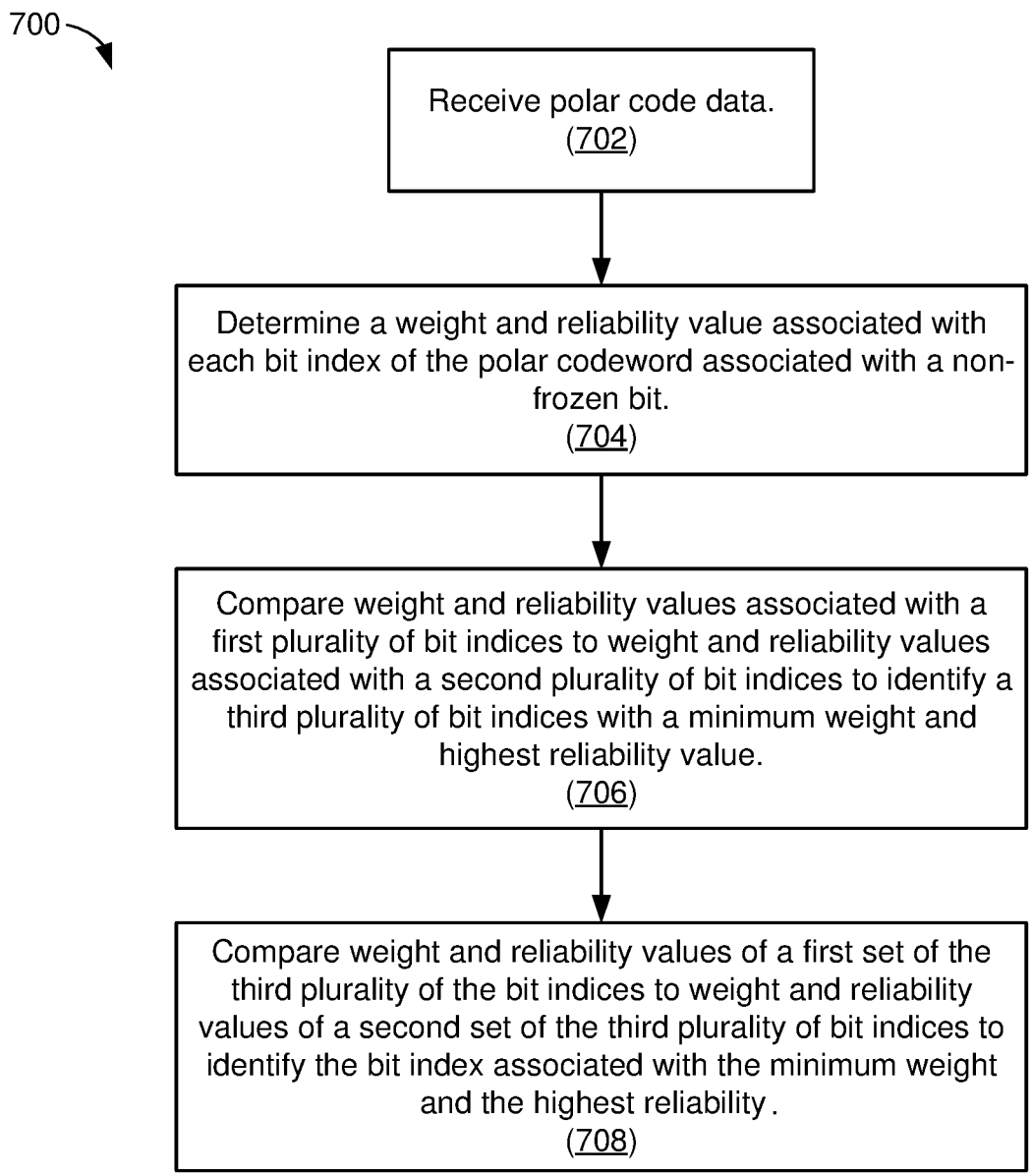
FIG. 7 shows an illustrative flowchart depicting an example operation for determining a bit index of a polar codeword having a minimum weight and a highest reliability value.

FIG. 7 shows an illustrative flowchart depicting an example operation 700 for determining a bit index of a polar codeword having a minimum weight and a highest reliability value. The operation 700 is described below with respect to the pc_wm index determination unit 400 of FIG. 4 for illustrative purposes only. The operation 700 may be used to operate the pc_wm index determination unit 500 of FIG. 5, or any other feasible pc_wm index determination unit.

The operation 700 begins by receiving polar codeword data (702). The polar codeword data may include the size of the information bits, the size of the polar codeword in bits, the size of the CRC data, rate matching sequence information, the number of parity bits, weight data, reliability values, the number of pc_wm bits, and the like.

Next, the pc_wm index determination unit 400 may determine a weight and a reliability value associated with each bit index associated with a non-frozen bit of the polar codeword (704). For example, the weight comparators 410-417 may identify the bit indices associated with the non-frozen bits. The weight comparators 410-417 may also determine weight and reliability values associated with the bit indices associated with the non-frozen bits.

Next, the pc_wm index determination unit 400 may compare weight and reliability values associated with a first plurality of bit indices to weight and reliability values associated with a second plurality of bit indices to identify a third plurality of bit indices having with a minimum weight and a highest reliability value (706). For example, the pc_wm index determination unit 400 may compare weight and reliability values for a first plurality of bit indices (using weight comparators 410, 412, 414, and 416) to weight and reliability values for a second plurality of bit indices (using weight comparators 411, 413, 415, and 417) to identify a third plurality of bit indices having a minimum weight and a highest reliability value (e.g., outputs 452, 453, 454, and 455).

The pc_wm index determination unit 400 may compare weight and reliability values of a first set of the third plurality of bit indices to weight and reliability values of a second set of the third plurality of the bit indices to identify the bit index associated with the minimum weight and the highest reliability value (708). For example, the pc_wm index determination unit 400 may compare weights and reliability values of a first set of the third plurality of bit indices (e.g., outputs 452 and 454) to weights and reliabilities from a second set of the third plurality of bit indices (e.g., outputs 453 and 455) to identify the bit index associated with the minimum weight and highest reliability value (using priority comparators 424-426). The bit index associated with the minimum weight and the highest reliability value may be selected as the bit index for a pc_wm parity bit polar codeword. In some implementations, the pc_wm index determination unit 400 may process successive portions of the polar codeword until all the bit indices of the polar codeword have been processed to identify the bit index for the pc_wm parity bit polar codeword.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus to determine an index of a parity bit in a polar codeword, the apparatus comprising:
   a first comparator configured to select a first bit index of the polar codeword and determine a first weight value associated with the first bit index;
   a second comparator configured to select a second bit index of the polar codeword and determine a second weight value associated with the second bit index; and a first priority comparator coupled to the first comparator and the second comparator and configured to:
  select a first minimum weight value representing the lesser of the first weight value and the second weight value; and
  identify a bit index of the polar codeword associated with the first minimum weight value, wherein the bit index of the parity bit in the polar codeword is based at least in part on the identified bit index associated with the first minimum weight value.

2. The apparatus of claim 1, wherein the first weight value represents a number of ones in a row of a Kronecker matrix used to determine a polar codeword value associated with the first bit index and the second weight value represents a number of ones in another row of the Kronecker matrix used to determine a polar codeword value associated with the second bit index.

3. The apparatus of claim 1, wherein the first priority comparator is further configured to:
  select the first weight value as the first minimum weight value in response to a determination that the first weight value is equal to the second weight value.

4. The apparatus of claim 3, wherein the first weight value has a higher reliability value than the second weight value.

5. The apparatus of claim 1, further comprising a register configured to store the first weight value and the first bit index associated with the first weight value provided by the first comparator.

6. The apparatus of claim 5, wherein the first comparator is further configured to select the first bit index from the first bit index stored in the register and a different bit index of the polar codeword.

7. The apparatus of claim 1 further comprising:
  a third comparator configured to select a third bit index of the polar codeword and determine a third weight value associated with the third bit index;
  a fourth comparator configured to select a fourth bit index of the polar codeword and determine a fourth weight value associated with the fourth bit index; and
  a second priority comparator coupled to the third comparator and the fourth comparator and configured to:
    select a second minimum weight value representing the lesser of the third weight value and the fourth weight value; and
    identify a bit index of the polar codeword associated with the second minimum weight value, wherein the index of the parity bit in the polar codeword is based at least in part on the identified bit index from the second priority comparator associated with the second minimum weight value.

8. The apparatus of claim 7, further comprising:
  a third priority comparator coupled to the first priority comparator and the second priority comparator and configured to:
  receive the first minimum weight value and the bit index associated with the first minimum weight value;
  receive the second minimum weight value and the bit index associated with the second minimum weight value; and
  select a third minimum weight value representing the lesser of the first minimum weight value and the second minimum weight value; and
  identify a bit index associated with the third minimum weight value, wherein the index of the parity bit in the polar codeword is based at least in part on the identified bit index associated with the third minimum weight value.

9. The apparatus of claim 8, wherein the third priority comparator is further configured to:
  select the first minimum weight value as the third minimum weight value in a response to a determination that the first minimum weight value is equal to the second minimum weight value.

10. A method to determine an index of a parity bit in a polar codeword comprising:
  selecting a first bit index of the polar codeword;
  determining a first weight value associated from the first bit index;
  selecting a second bit index of the polar codeword;
  determining a second weight value associated with the second bit index;
  selecting a first minimum weight value representing the lesser of the first weight value and the second weight value; and
  identifying a bit index of the polar codeword associated with the first minimum weight value, wherein the bit index of the parity bit in the polar codeword is based at least in part on the identified bit index associated with the first minimum weight value.

11. The method of claim 10, wherein the first weight value represents a number of ones in a row of a Kronecker matrix used to determine a polar codeword value associated with the first bit index and the second weight value represents a number of ones in another row of the Kronecker matrix used to determine a polar codeword value associated with the second bit index.

12. The method of claim 10, wherein selecting the first minimum weight value comprises:
  selecting the first weight value as the first minimum weight value in response to determining that the first weight value is equal to the second weight value.

13. The method of claim 12, wherein the first weight value is associated with a higher reliability value than the second weight value.

14. The method of claim 10, further comprising:
  storing the first weight value and the first bit index associated with the first weight value.

15. The method of claim 14, wherein selecting the first bit index comprises selecting the first bit index from the stored first bit index and a different bit index of the polar codeword.

16. The method of claim 10, further comprising:
  selecting a third bit index of the polar codeword;
  determining a third weight value associated with the third bit index;
  selecting a fourth bit index from the polar codeword;
  determining a fourth weight value associated with the fourth weight value;
  selecting a second minimum weight value representing the lesser of the third weight value and the fourth weight value; and
  identifying a bit index of the polar codeword associated with the second minimum weight value, wherein the index of the parity bit in the polar codeword is based at least in part on the identified bit index associated with the second minimum weight value.

17. The method of claim 16, further comprising:
  selecting a third minimum weight value representing the lesser of the first minimum weight value and the second minimum weight value; and
  identifying a bit index associated with the third minimum weight value, wherein the index of the parity bit in the polar codeword is based at least in part on the identified bit index associated with the third minimum weight value.

18. The method of claim 17, further comprising:
selecting the first minimum weight value as the third minimum weight value in response to determining that the first minimum weight value is equal to the second minimum weight value.

19. A device comprising:
a transceiver configured to transmit a polar codeword; and
an apparatus configured to determine an index for a parity bit of the polar codeword comprising:
   a first comparator configured to select first bit index of the polar codeword and determine a first weight value associated with the first bit index;
   a second comparator configured to select a second bit index of the polar codeword and determine a second weight value associated with the second bit index; and
   a first priority comparator coupled to the first comparator and the second comparator and configured to:
      select a first minimum weight value representing the lesser of the first weight value and the second weight value; and
      identify a bit index of the polar codeword associated with the first minimum weight value, wherein the bit index of the parity bit in the polar codeword is based at least in part on the identified bit index associated with the first minimum weight value.

20. The device of claim 19, wherein the apparatus further comprises a register configured to store the first weight value and the first bit index associated with the first weight value provided by the first comparator, wherein the first comparator is further configured to select the first bit index from the first bit index stored in the register and a different bit index of the polar codeword.

* * * * *